(12) United States Patent
Muro et al.

(10) Patent No.: US 9,042,422 B2
(45) Date of Patent: May 26, 2015

(54) TUNABLE EXTERNAL RESONATOR LASER

(75) Inventors: Kiyohumi Muro, Chiba (JP); Tomohisa Endo, Chiba (JP); Yasutaka Shimada, Chiba (JP); Daisuke Fukuoka, Chiba (JP)

(73) Assignee: NATIONAL UNIVERSITY CORPORATION CHIBA UNIVERSITY, Chiba (JP)

( * ) Notice: Subject to any disclaimer, the term of this patent is extended or adjusted under 35 U.S.C. 154(b) by 112 days.

(21) Appl. No.: 13/519,463

(22) PCT Filed: Dec. 30, 2010

(86) PCT No.: PCT/JP2010/073841
§ 371 (c)(1),
(2), (4) Date: Mar. 8, 2013

(87) PCT Pub. No.: WO2011/081212
PCT Pub. Date: Jul. 7, 2011

(65) Prior Publication Data
US 2013/0177033 A1 Jul. 11, 2013

(30) Foreign Application Priority Data
Dec. 30, 2009 (JP) ................................. 2009-299284

(51) Int. Cl.
*H01S 3/08* (2006.01)
*H01S 5/06* (2006.01)
(Continued)

(52) U.S. Cl.
CPC . *H01S 5/06* (2013.01); *H01S 5/143* (2013.01); *H01S 5/02248* (2013.01); *H01S 5/0286* (2013.01); *H01S 2301/02* (2013.01); *H01S 5/1085* (2013.01)

(58) Field of Classification Search
CPC ....... H01S 5/06; H01S 5/143; H01S 5/02248; H01S 5/0286; H01S 2301/02; H01S 5/1085
USPC ............... 372/20, 36, 50.11, 93, 99, 102, 108
See application file for complete search history.

(56) References Cited

U.S. PATENT DOCUMENTS 5,499,262 A * 3/1996 Nakata ........................... 372/108
6,118,802 A * 9/2000 Sanders et al. ................ 372/50.1
(Continued)

FOREIGN PATENT DOCUMENTS

DE  19832750 A1 *  2/2000  ................ H01S 5/10
JP  04-105382  4/1992
(Continued)

OTHER PUBLICATIONS

De Labachelerie et al., "Mode-hop suppression of Littrow grating-tuned lasers," Applied Optics, Jan. 20, 1993, pp. 269-274, vol. 32, No. 3.
(Continued)

*Primary Examiner* — Yuanda Zhang
(74) *Attorney, Agent, or Firm* — Knobbe, Martens, Olson & Bear LLP

(57) ABSTRACT

Disclosed is an ASE-free continuously tunable external resonator laser in which reduction in tuning range and decrease in output are suppressed. The external resonator laser comprises: a fixed support body which has a half mirror that partially reflects incident light and partially transmits incident light fixed therein; and a rotatory support body which is rotatably supported by the fixed support body by way of a shaft, and which has a laser chip that emits light, a collimator lens that collimates light emitted from the laser chip, and a diffraction grating that diffracts light emitted from the laser chip, fixed therein.

8 Claims, 20 Drawing Sheets

(51) Int. Cl.
*H01S 5/14* (2006.01)
*H01S 5/022* (2006.01)
*H01S 5/028* (2006.01)
*H01S 5/10* (2006.01)

(56) References Cited

U.S. PATENT DOCUMENTS

| | | | |
|---|---|---|---|
| 6,625,183 B1* | 9/2003 | Hand et al. | 372/20 |
| 2002/0024979 A1* | 2/2002 | Vilhelmsson et al. | 372/20 |
| 2007/0223554 A1* | 9/2007 | Hunter et al. | 372/102 |

FOREIGN PATENT DOCUMENTS

| | | | |
|---|---|---|---|
| JP | 05167143 A * | 7/1993 | H01S 3/043 |
| JP | 2008-130805 | 6/2008 | |

OTHER PUBLICATIONS

De Labachelerie et al., "Mode-hop suppression of Littrow grating-tuned lasers: erratum," Applied Optics, Jun. 20, 1994, pp. 3817-3819, vol. 33, No. 18.

Liu et al., "Novel geometry for single-mode scanning of tunable lasers," Optics Letters, Mar. 1981, pp. 117-118, vol. 6, No. 3.

International Search Report and Written Opinion received in International Patent Application No. PCT/JP2010/073841, dated Mar. 29, 2011, filed Dec. 30, 2010.

* cited by examiner (a)

(b)

TUNABLE EXTERNAL RESONATOR LASER

The present invention relates to a tunable external resonator laser.

TECHNICAL FIELD

A wavelength tunable laser is very useful in the field of analysis for material structure and chemical compound, and an external resonator laser is one kind of the wavelength tunable laser. In general, the external resonator laser has an optical gain medium (a light source), and an external resonator which allows light emitted from the optical gain medium to resonate, and thus emission wavelength can be adjusted by tuning resonance frequency of the external resonator. In particular, the external resonator laser using a semiconductor laser diode as a gain medium has advantages that it can apply to a wide wavelength region and be manufactured with miniaturization, convenience, and low cost.

There are various types of external resonator lasers. For instance, it has been known that a laser capable of continuously tuning wavelength without mode-hop has Littrow-type or Littman-type arrangement. Littman-type in the same as Littrow-type is also configured in the external resonator by using diffraction grating. In Littrow-type, a diffraction grating is rotated with respect to a laser beam, whereas in Littman-type, a diffraction grating is fixed with respect to a laser beam. For this reason, area of laser light irradiated onto the diffraction grating can be widen, which allows a resonator arrangement to have small size and high resolution performance. In addition, Littman-type has been widely used as a wavelength tunable laser, since there is a merit that the direction of output light does not change while wavelength varies.

Prior art for an external resonator laser of Littrow-type is disclosed below in non-patent reference 1. Prior arts for an external resonator laser of Littman-type are also disclosed below in non-patent reference 2 and patent references 1, 2, and 3.

Among them, the external resonator laser of Littman-type can continuously tune wavelength in wide band and it becomes a representative external resonator used in the wavelength tunable laser, since an output beam is not shaken through wavelength tuning. However, because zero-order diffracted light at a diffraction grating is derived as the output beam, spontaneous emission of a laser diode is superposed in the output beam, and thus high-precision measurements of detection, absorption, and reflection for weak light emission such as Raman scattering spectroscopy become very difficult. Prior arts considered to solve this problem are disclosed in patent references 4, 5, 6, 7, and 8.

REFERENCES FOR PRIOR ARTS

Non-Patent References

Non-patent reference 1: M. de Labachelerie and G. Passedat, "Mode-hop suppression of Littrow grating-tuned lasers", Applied Optics Vol. 32, no. 3, 269(1993), Vol. 33, no. 18, 3817 (1994)

Non-patent reference 2: Liu and Littman, "Novel Geometry for single-mode scanning of tunable Lasers", Optics Letters Vol. 6, no. 3, 117 (1981)

Patent References

Patent reference 1: U.S. Pat. No. 5,319,668
Patent reference 2: U.S. Pat. No. 6,625,183
Patent reference 3: U.S. Pat. No. 6,614,829
Patent reference 4: U.S. Pat. No. 5,657,120
Patent reference 5: U.S. Pat. No. 6,606,340
Patent reference 6: U.S. Pat. No. 6,608,847
Patent reference 7: U.S. Pat. No. 6,690,709
Patent reference 8: U.S. Pat. No. 6,788,726

SUMMARY OF THE INVENTION

Technical Problems

As disclosed in above patent references 1, 2, 3 and above non-patent reference 2, Littman-type external resonator arrangement is the most commonly used in external resonator arrangement, since emission wavelength can be continuously changed by properly selecting a pivot axis to rotate a mirror, while the ratio of resonator length of the external resonator to wavelength satisfying diffraction condition at diffraction grating is being kept at a certain value.

However, in the external resonator laser, spontaneous emission of a laser chip (ASE: Amplified Spontaneous Emission) is superposed in the output beam, since zero-order light of the diffraction grating is derived as output. The ASE is very strong particularly in the case where light is emitted from both sides of the gain band, and it sometimes happens that the ASE is stronger than the emission line, depending on the situation. The superposition of the ASE in the output beam becomes big problem regarding Raman scattering measurement, high sensitive measurement such as single molecular light emission measurement, transparency measurement of high optical density material, high-precision measurement of reflection in low reflectivity, and the like. It is strongly required in various fields that a laser light source is ASE-free and has high spectral purity.

As disclosed in above patent references 4, 5, 6, 7, and 8, various prior arts has been developed for the subject. For example, prior art described in patent 4 can substantiate a light source having high spectral purity without containing spontaneous emission (ASE), since light emitted from a laser diode is derived as first-order diffracted light at a diffraction grating. However, in these prior arts, there is a problem that mode-hope-free continuous wavelength tuning like Littman arrangement or Littrow arrangement is extremely difficult, since resonator length is fixed.

In addition, in the prior art disclosed in above patent 5, spontaneous emission of the laser diode can be removed from output. Furthermore, a mirror, a lens, and a fiber are rotated as a unit around pivot axis, thereby being capable of deriving output from the fiber while wavelength is continuously varied. However, in this prior art, not only decreases output substantially, but an optical system also becomes enormously complex, and thus making the adjustment of optical axis extremely difficult.

In addition, in the prior art disclosed in patent reference 6, a beam splitter is inserted between a laser diode and a diffraction grating, and a beam returns to the laser diode through reflection by a mirror and diffraction by the diffraction grating. And then output light is obtained by partially reflecting the beam at the beam splitter. Certainly, this type has advantage that the output beam having no spontaneous emission can be derived without beam shaking due to the tuning. However, there are several problems that loss of the resonator becomes larger, output efficiency becomes lower, and reduction of wavelength tuning band becomes larger, since the beam inversely propagating is also reflected in the beam splitter.

In addition, in the prior art disclosed in the above patent reference 7, a polarization beam splitter cube and a Faraday rotator are inserted between a gain medium and a refraction grating to derive an output beam which has no spontaneous emission from the polarization beam splitter cube. However, a lot of optical parts are necessary in this prior art. Not only increases loss in the resonator, but loss in the diffraction grating also increases due to rotation of polarization surface by the Faraday rotator, so that problem with low output efficiency and reduced tuning region happens. Furthermore, in a wavelength tunable laser without mode-hop, it is necessary to control resonator length by wavelength-order. However, there is a problem that resonator length becomes larger, and thus conditions for vibration and temperature become unstable, since new optical parts are inserted to the inside of the resonator.

In addition, in the prior art disclosed in the above patent reference 8, a polarization beam splitter, a Faraday rotator, and a polarization rotator are inserted between a gain medium and a diffraction grating, and then polarization rotation generated by the Faraday rotator disclosed in the patent reference 7 is compensated by the polarization rotator, so that useless resonator loss is reduced to efficiently derive output without spontaneous emission. However, in this prior art, loss in the resonator further increases, since a lot of optical elements are used. Moreover, a problem regarding stability occurs, since resonator length becomes longer.

Therefore, considering the problems in the above prior arts, the present invention has an objective to provide an external resonator laser being free of spontaneous emission (ASE-free) with miniaturization, convenience, and continuous wavelength tunability by suppressing reduction in tuning range and decrease in output.

Solution to the Problems

In order to solve the above mentioned problems, an external resonator laser according to one aspect of the present invention comprises a fixed support body in which a half mirror partially reflecting incident light and partially transmitting incident light is fixed, and a rotatory support body which is rotatably supported by the fixed support body by way of a shaft, and in which a laser chip emitting light, a collimator lens collimating light emitted from the laser chip, and a diffraction grating diffracting light emitted from the laser chip are fixed. And laser chip, collimator lens, diffraction grating and half-mirror constitutes a Littman-type resonator geometry.

Advantageous Effects of the Invention

As mentioned above, the present invention can provide an ASE-free external resonator laser with miniaturization, convenience, and continuous wavelength tunability by suppressing reduction in tuning range and decrease in the output.

BEST MODE FOR CARRYING OUT THE INVENTION

Hereinafter, embodiments of the present invention are described while referring to the figures. The present invention can be achieved in a lot of different embodiments and examples. However, the present invention is not limited thereto.

Embodiment 1

Figure 1:
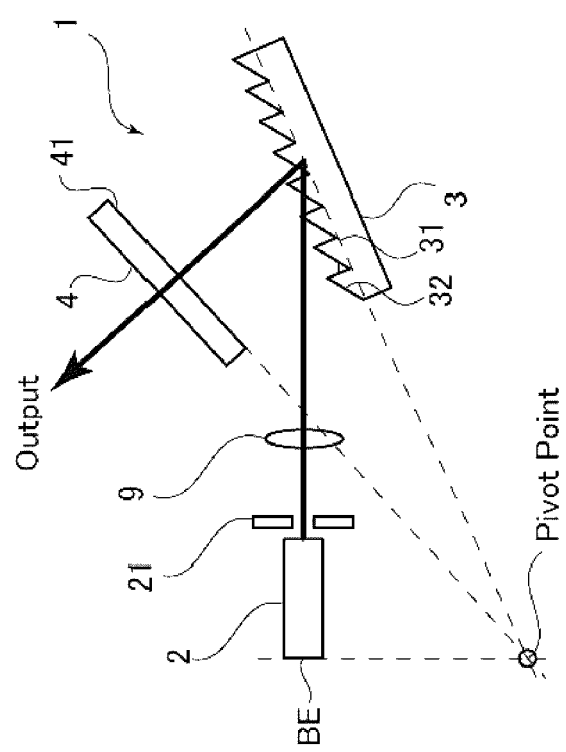
FIG. 1 is a schematic view of an optical system for an external resonator laser according to one embodiment of the present invention.

FIG. 1 is a schematic view of an optical system for an external resonator laser 1 according to one embodiment of the present invention. The external resonator laser 1 has a laser chip 2 emitting light, a diffraction grating 3 diffracting light emitted from the laser chip 2, and a half mirror 4 partially reflecting light and partially transmitting light from the diffraction grating 3. Furthermore, in this embodiment, a collimator lens 9 is placed between the laser chip 2 and the diffraction grating 3 so that light emitted from the laser chip 2 becomes parallel light. In the external resonator laser 1, an external resonator with resonator arrangement of Littman-type comprises the laser chip 2, the diffraction grating 3, and the half mirror 4.

Figure 2:
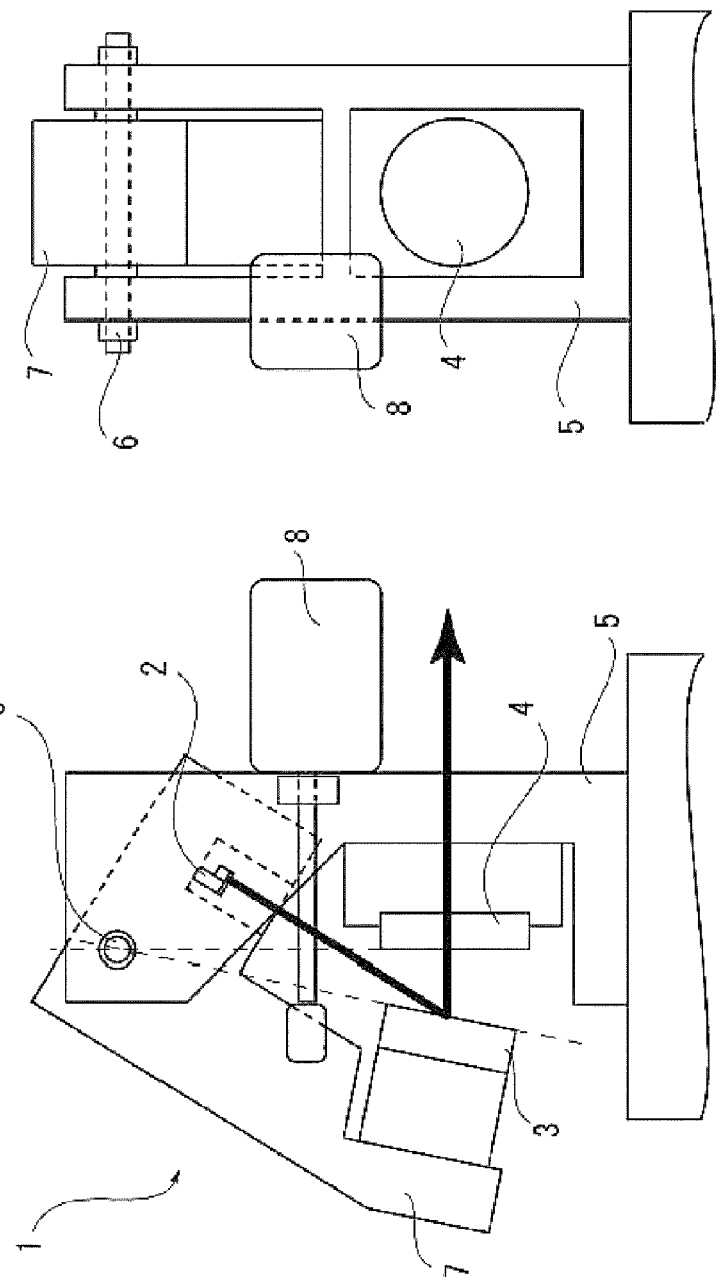
FIG. 2 is a schematic view of structure for an external resonator laser according to one embodiment of the present invention.

FIG. 2 is a schematic view of configuration for an external resonator laser 1 according to one embodiment of the present invention. As shown in the above description and FIG. 2, in the external resonator laser 1, the half mirror 4 is fixed in the fixed support body 5, and the laser chip 2, the collimator lens 9, and the diffraction grating 3 are fixed in the rotatory support body 7. In addition, the rotatory support body 7 is rotated around a shaft 6 by driving mechanism 8 disposed on the fixed support body 5. That is, the rotatory support body 7 is rotatably supported by the fixed support body 5 by way of the shaft 6.

Figure 3:
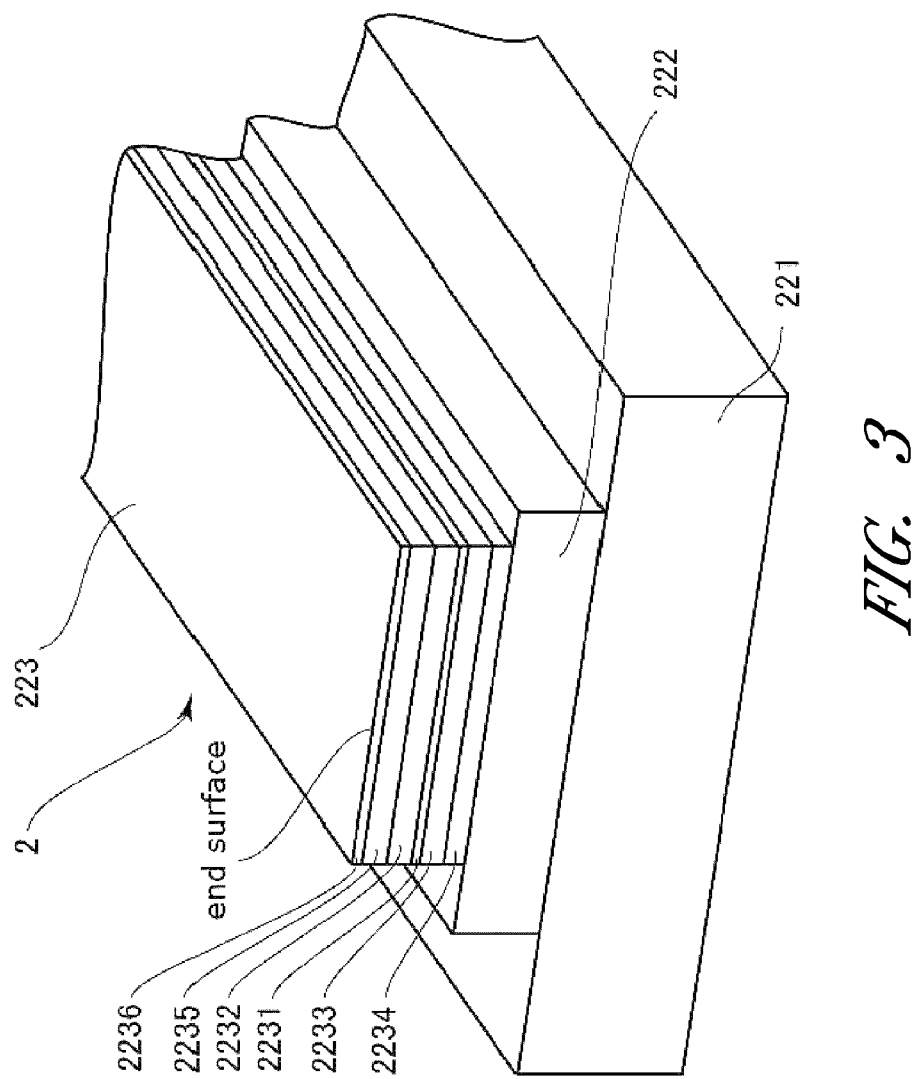
FIG. 3 is a schematic view of a laser chip.

The laser chip 2 is one which is capable of emitting light, however it is not limited to any kind. As shown in FIG. 3, the laser chip 2 has a mount 221, a submount 222 fixed on the mount 221 via an adhesive layer such as solder, and a laser diode 223 fixed on the submount 222 via an adhesive layer. The laser diode 223 comprises an active layer 2231, a p-type waveguide layer 2232 and a n-type waveguide layer 2233 wherein the active layer 2231 is inserted between the p-type waveguide layer 2232 and the n-type waveguide layer 2233, a p-type clad layer 2234 and a n-type clad layer 2235 wherein these layers are inserted between the p-type clad layer 2234 and the n-type clad layer 2235, an electrode layer 2236 wherein the active layer 2231 is inserted between the mount 221 and the electrode layer 2236. In the laser chip 2 shown in FIG. 2, electric current is applied between the electrode 2236 and the mount 221 to emit light from the light emission layer, and then light is emitted from the vertical direction with regard to the laminated direction by directionally guiding the light emission. As for the laser chip 2 according to the present embodiment, in the rear-end-face (end face of opposite side to the diffracting grating 3) of the laser diode 223, a reflection layer reflecting incident light is formed. In addition, as a wavelength range of light emitted from the laser diode 223, it can be properly adjusted corresponding to wavelength of emitted laser light, however it is not limited to any kind. For example, the wavelength range is preferably from 700 nm to 1200 nm, and more preferably from 900 nm to 1000 nm.

Figure 4:
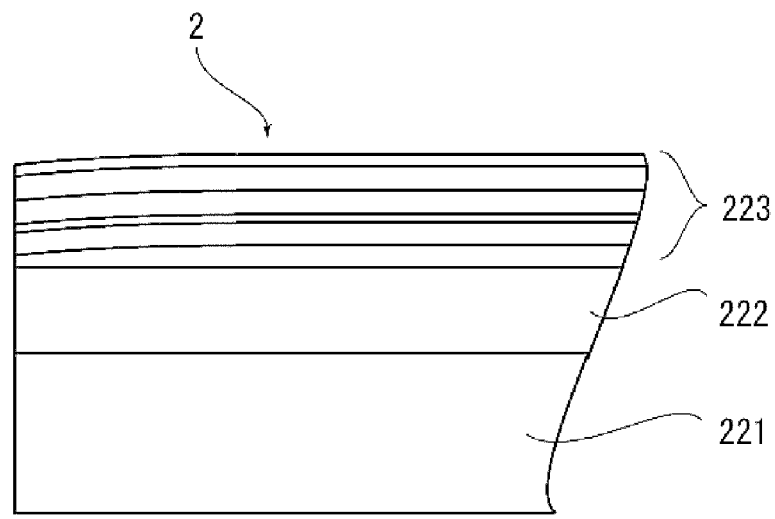
FIG. 4 is a schematic cross-sectional view of one embodiment of a laser chip.
Figure 5:
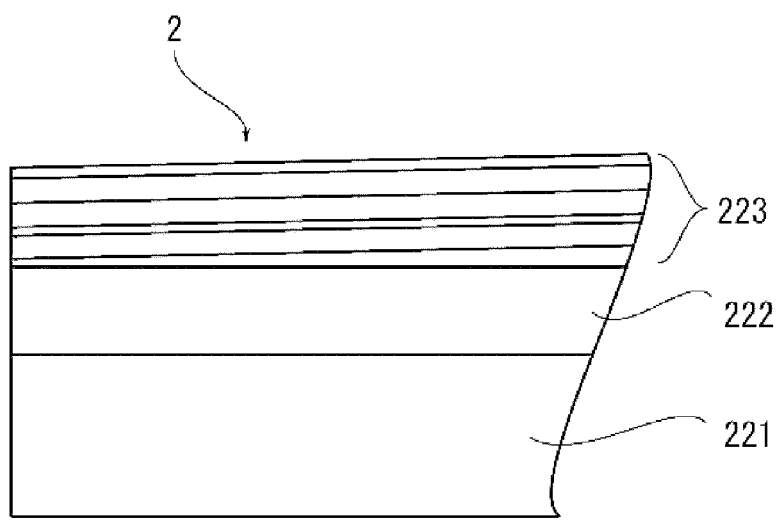
FIG. 5 is a schematic cross-sectional view of another embodiment of a laser chip.

In addition, each layer of the laser chip 2, as shown in FIG. 3, is one which may be laminated parallel to the surface of the submount 222, or may incline with respect to the submount 222, so that the laser chip 2 has a waveguide tilted from the vertical direction of the fore-end-face (surface of light emission). The laser chips having the tilted waveguide are also exemplified as below. For instance, as shown in FIG. 4, a curved waveguide of which inclination increases toward the fore-end-face is illustrated, and as shown in FIG. 5, an oblique waveguide linearly tilted is also illustrated. A residual reflection at the fore-end-face, which becomes a cause of parasitic oscillation or mode-hop, can be efficiently reduced by inclining the fore-end-face. In addition, the inclining angle with respect to the fore-end-face is not limited as long as the above effect is obtained, and for example the inclining angle is preferably in the range of 3 degree or more with respect to the vertical direction of the fore-end-face, and more preferably in the range of not less than 4 degree and not more than 10 degree.

Figure 6:
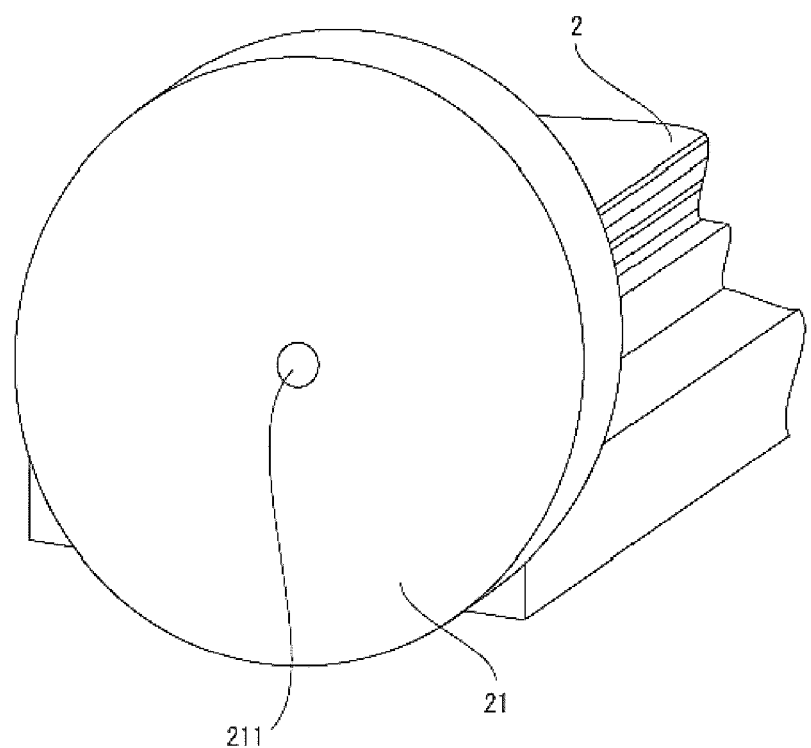
FIG. 6 is a schematic perspective view of one embodiment of a light scattering body.
Figure 7:
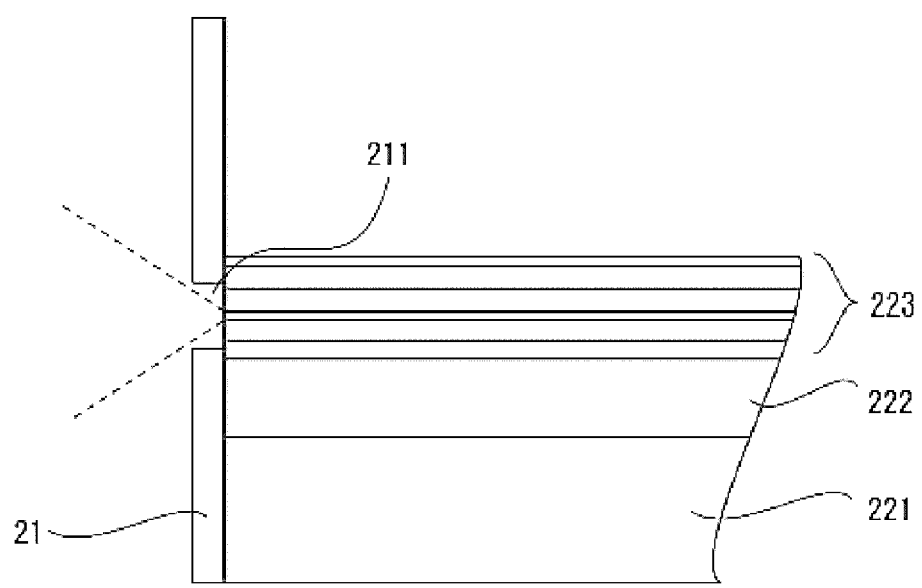
FIG. 7 is a schematic cross-sectional view of one embodiment of a light scattering body.

FIGS. 6 and 7 are schematic views of an example of a light scattering body according to the embodiment of the present invention. FIGS. 6 and 7 are a schematic perspective view and a schematic cross-sectional view of the light scattering body, respectively. In the side of the fore-end-face of the laser chip 2, a light scattering body beam filter using a light scattering body thin film 21 is formed. The light scattering body thin film 21 is capable of scattering light, however it is not limited to any kind, for instance ceramic is preferably used. The light scattering body thin film 21, without limitation, is preferably formed to cover the mount 221 and the submount 222. Parasitic oscillation is mainly generated by the reflection from the mount 221, the submount 222, and the adhesion layer such as solder necessarily existing between them. For this reason, it is preferable that the light scattering body thin film 21 is at least formed to cover the fore-end-faces of the mount 221 and the submount 222. In this way, the parasitic oscillation resulting from optical feedback through various optical paths in the external resonator can be efficiently suppressed. Thickness of the light scattering body thin film 21, which is adjustable by the condition such as kind of material, is preferably not less than 0.3 mm and not more than 1 mm, and is more preferably 0.7 mm or less, when ceramic is used.

In addition, a shape of the light scattering body thin film 21 is not limited as long as the fore-end-faces of the mount 221 and the submount 222 are covered. For example, it may have the same shape as the shapes of the mount 221 and the submount 222, or may also have a rectangular shape covering the total shapes thereof. One preferred example is a circular shape in which a pinhole 211 (a microscopic hole) is formed. In this case, size of the pinhole 211 is not limited as long as light emitted from the laser diode 223 and light returned from the diffraction grating 3 can transmit through the pinhole 211. For example, size of the pinhole 211 is preferably not less than 0.3 mm and not more than 1 mm, and more preferably not less than 0.5 mm and not more than 0.8 mm, when the light scattering body, which has thickness of not less than 0.3 mm and not more than 1 mm, is used. Thus, the mount 221 and the submount 222 are efficiently covered, and then light emitted from the laser diode 223 is fully transmitted, so that the possibility of light scattering becomes smaller, even though the light emitted from the laser diode 223 spreads out with wide-angle. In addition, the light scattering body beam filer according to the present embodiment may be fixed by other support member separated from front-surface of the laser chip 2. However, the light scattering body beam filter is preferably pasted at the fore-end-faces of the mount 221 and the submount 222, and more preferably pasted at the fore-end-face of the mount 221 via an adhesive member, in that unnecessary light is required to be scattered, and necessary light is not required to be scattered. The light scattering body beam filter can facilitate wavelength tuning throughout the whole gain region without being troubled with parasitic oscillation, and thus characteristic degradation under high output power operation is enormously reduced. However, it may also be omitted.

Figure 8:
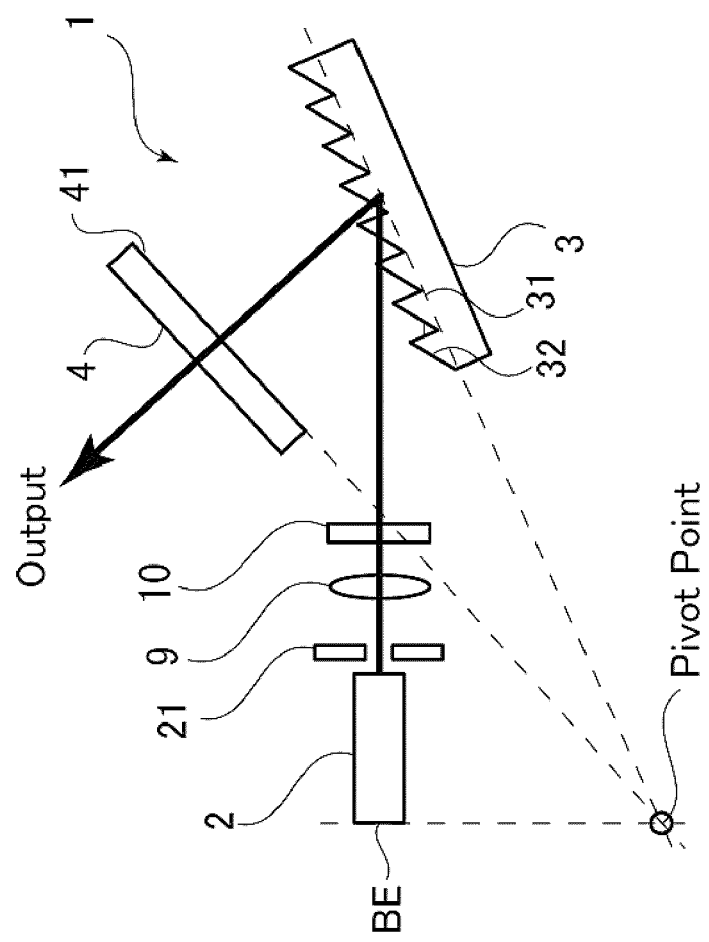
FIG. 8 is a schematic view of an optical system for an external resonator laser equipped with a λ/2 plate.

The collimator lens 9 according to the present embodiment shown in FIG. 8 is a lens for allowing light emitted from the laser chip 2 to be parallel. Collimated light via the collimator lens 9 is diffracted and reflected at the diffraction grating 3 and the half mirror 4, respectively, and then light enters again into the collimator lens 9, and then the light is condensed again to enter the laser chip 2.

The diffraction grating 3 according to the present embodiment allows light with a pre-defined wavelength among the light emitted from the laser chip 2 to diffract, and then light enters into the half mirror 4 in a vertical direction. On the other hand, reflected light from the half mirror 4 is also required to diffract, and then reflected light enters into the laser chip 2 again. The diffraction grating 3 is not specified as long as the above function is obtained. A preferred example is the diffraction grating having a plurality of serrations on its surface (a blazed diffraction grating).

The half mirror 4 according to the present embodiment allows incident light from the diffraction grating 3 partially to reflect, and then partially reflected incident light returns to the diffraction grating 3, whereas incident light partially transmits through the half mirror, and thus partially transmitted light can be emitted into the outside of the external resonator. The half mirror 4 is not limited as long as the above function is obtained, for example, a conventional half mirror can be used.

In the present embodiment, the diffraction grating 3 and the half mirror 4 are not only arranged to opposite each other with a certain angle so that light emitted from the laser chip 2 returns to the laser chip 2 again after diffraction and reflection of light, but they are also arranged to be capable of continuously varying emission wavelength by simultaneously changing length of optical length of resonator by adjusting the angle opposite to each other. For example, as shown in FIG. 1, surface 31 on the diffraction grating 3 and surface 41 on the half mirror 4 are respectively arranged to be always in alignment with straight line through center of the rotation (pivot axis).

In addition, the fixed support body 5 according to the present embodiment is a part for being fixed and supported at the body in which the external resonator is arranged, and the half mirror 4 is fixed therein. As material and structure, there is no limitation as long as configuration part such as the half mirror can be fixed. It is preferred that material has good machinability. A preferred example is that the fixed support body 5 is made from metal.

In addition, the rotatory support body 7 according to the present embodiment, which becomes rotatable by way of the shaft 6 at the fixed support body 5, is a part for fixing the laser chip 2, the collimated lens 9, and the diffraction grating 3. An opposite angle between the diffraction grating 3 and the half mirror 4, and length of optical path are changeable by rotating the rotatory support body 7. In addition, the shaft 6 is center of rotation, and is preferably designed to elongated line of the rear-end-face of the laser chip 2 (i.e., Littman-type arrangement).

In this embodiment, it is preferred that a λ/2 plate 10 is further inserted between the collimator lens 9 and the diffraction grating 3. In FIG. 8, a schematic view of the λ/2 plate 10 is shown. In general, light emitted from the laser chip 2 is a linearly polarized light. However, in the case where high diffraction efficiency is not obtained in the polarization direction with respect to the diffraction grating, the λ/2 plate 10 is arranged at suitable angle, so that the polarization direction is controlled for obtaining high diffraction efficiency, thereby good tunability and high output power can be realized. In addition, it is preferred that the λ/2 plate 10 is also fixed in the rotatory support body 7, since the λ/2 plate 10 is necessary to be fixed considering relation of position between the laser chip 2 and the diffraction grating 3.

Figure 9:
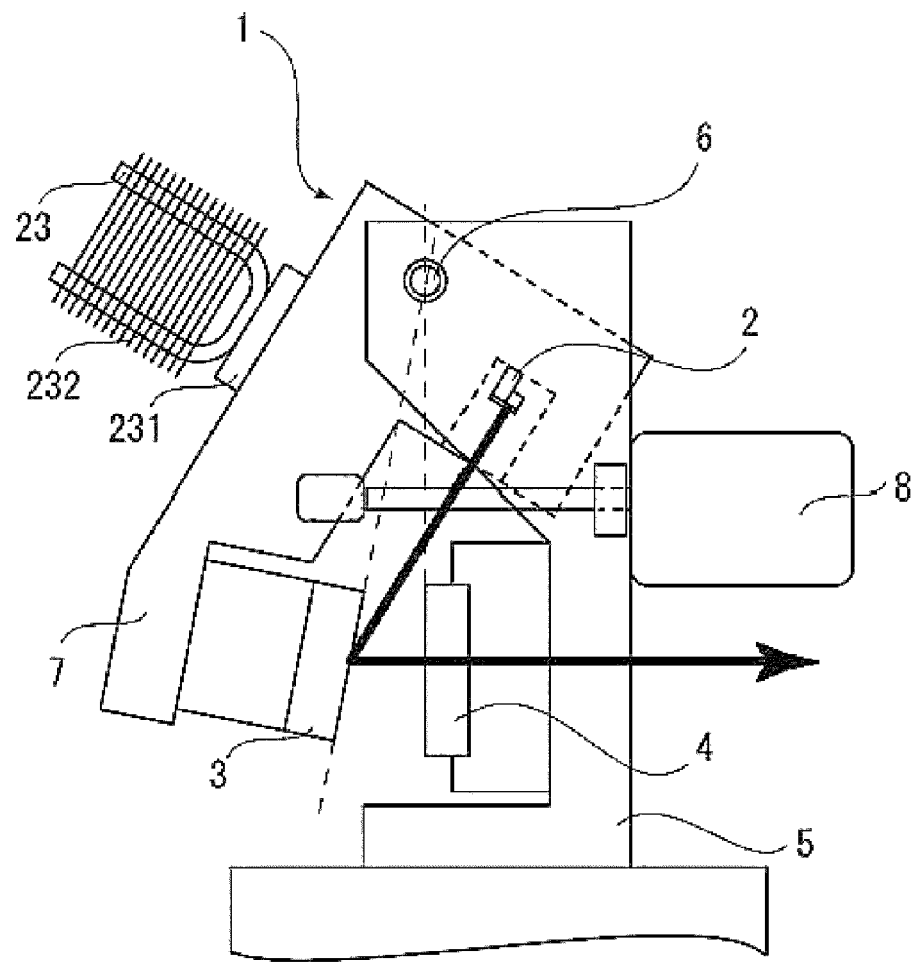
FIG. 9 is a schematic view of configuration for an external resonator laser equipped with a cooling member.

In addition, the laser chip 2 generates heat when it emits light. It is preferred that a cooling member 23 is provided for stabilizing the resonator, since generation of heat makes the resonator unstable. The cooling member 23 is also directly or indirectly fixed in the rotatory support body 7. As the cooling member 23, there is no limitation as long as increase of temperature due to generation of heat from the laser chip 2 can be removed. It is preferred that the cooling member 23 has small size and light weight. A preferred example is that radiating fins 232 with light weight heat pipes are attached to a peltier element. In FIG. 9, the external resonator laser configuration equipped with the cooling member 23 is shown as a side view.

The external resonator laser 1 according to the present embodiment is not necessary to arrange the optical element such as a beam splitter again in the resonator as described in the prior art, only by fixing the half mirror 4 to the fixed support body 5, and by deriving a portion of the diffracted light through the half mirror 4. As a result, simplicity and miniaturization of the device can be achieved. Furthermore, the ASE-free external resonator laser suppressing reduction in tuning range and decrease of output can be provided. In particular, even though emission wavelength is changed by taking different angles between the diffraction grating and the half mirror, laser light can always emit in the same direction, since the half mirror is fixed to be motionless.

As aforementioned in the present embodiment, the ASE-free external resonator laser suppressing reduction in tuning range and decrease of output with simplicity and miniaturization can be provided.

EXAMPLES

Here, the external resonator laser according to the present embodiment was actually fabricated, and then the effect thereon was confirmed. Such result is described below.

Example 1

Figure 10:
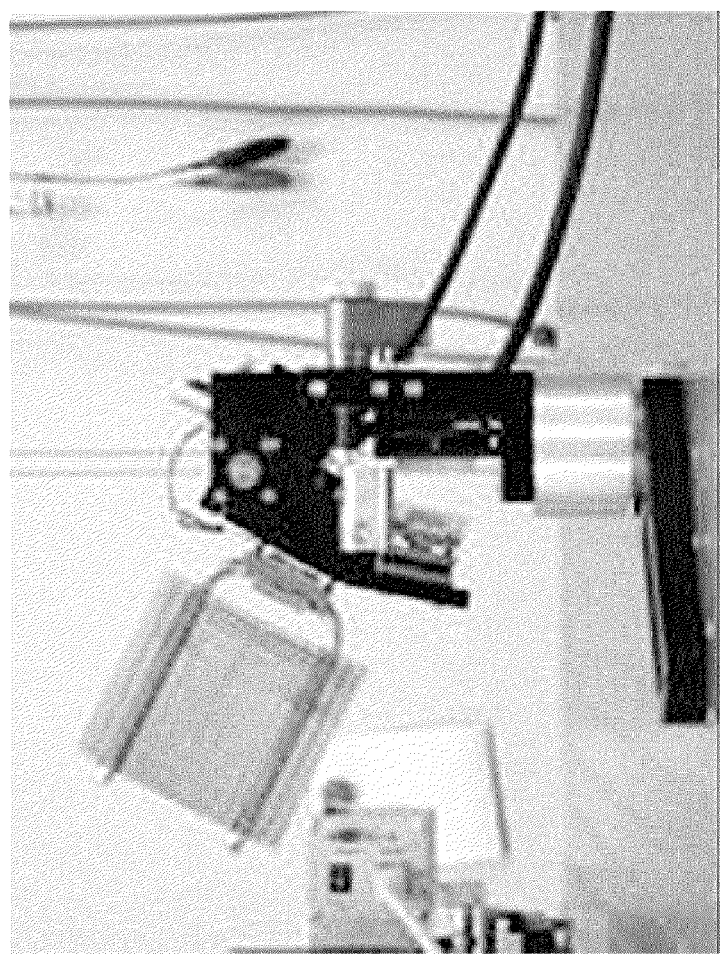
FIG. 10 is a photographic view of an external resonator laser fabricated according to the present example.

FIG. 9 shows the laser structure of example 1. FIG. 10 is a photographic view of an external resonator laser fabricated according to the present example. As the laser chip 2, the submount was fixed over the mount of copper via solder layer, and then the laser diode was fixed over the submount via solder layer. As the laser diode, a diode (OPTOENERGY company: SLD-A4010613092) having curved waveguide structure (5 degree of inclination) of gain peak wavelength of 1060 nm at conventional time was used. In addition, this super luminescence diode had curved waveguide structure shown in the present example and had inclination with respect to the end-face, whereby the residual reflection at the end-face, which became a cause of parasitic oscillation or mode-hop, could be extremely reduced. In addition, the diode is not limited to any kind, and for example could be fabricated by the method disclosed in "T. Fujimoto, Y. Yamada, Y. Yamada, A. Okubo, Y, Oeda and K. Muro, "High Power InGaAs/AlGaAs Laser Diodes with Decoupled Confinement Heterostructure", SPIE 3625, p. 38-45 (1999)". In addition, as the collimator lens 9 according to the present example, Geltech (registered trademark), which had aspheric lens of pressed glass, focal length of 8 mm, numerical aperture of 0.50, and non-reflective coating in the range of from 650 nm to 1050 nm, was used. The diffraction grating 3 (NewPort company, serial number 10RG 1200-1000-2) having 1200 L/mm was used. The half mirror 4 having reflection rate of 50%(CVI company, serial number PR1-1020-50-1025) was used. In addition, the laser chip 2, the collimator lens 9, and the diffraction grating 3 were fixed to the rotatory support body 7. The half mirror 4 was fixed in the fixed support body 5 and was precisely adjustable. In addition, the rotatory support body 7 was fixed to the fixed support body 5 by way of the shaft. The shaft was designed to be pivot point (center of rotation) with respect to external resonator arrangement of Littman-type. In addition, in the fore-end-face of the mount, the light scattering body comprising of ceramic, in which pinhole having 0.6 mm of diameter was formed, was arranged to be attached by a cohesive member. The incident angle of the collimated beam from the laser diode with respect to the diffraction grating was set to 75 degree, and the longitudinal direction of the parallel beam was coincided with the diffracted direction so that high wavelength resolution performance was obtained with respect to the diffraction grating within the arrangement of the laser diode. In addition, the λ/2 plate 10 was inserted between the collimated lens 9 and the diffraction grating 3 in order to obtain maximum diffraction efficiency with respect to the diffraction grating 3, since the polarization direction of laser emission became that of low diffraction efficiency.

The external resonator laser was driven under the conditions of 25° C. and 400 mA, and thus laser light was emitted.

Figure 11:
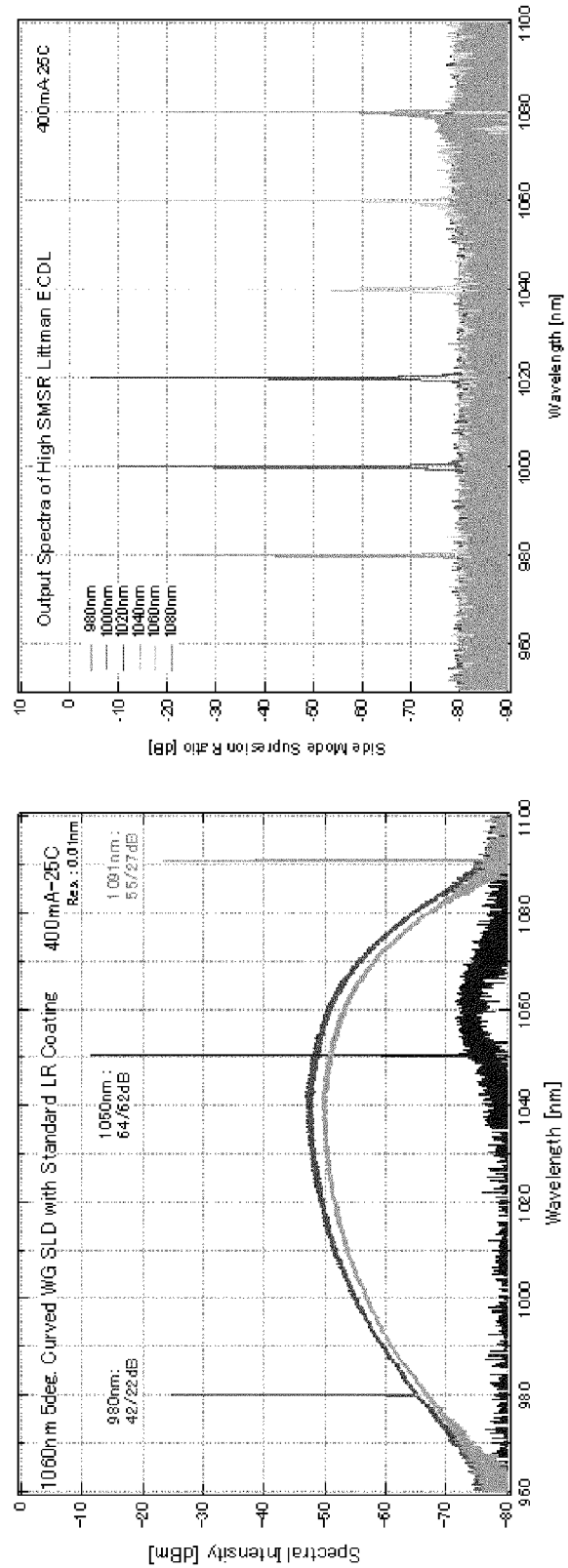
FIG. 11 shows results of outputs with respect to wavelength of external resonators for a conventional type and the present example.

FIG. 11 shows output spectrums with a resolution in 0.01 mm of the external resonator laser and the conventional Littman-type external resonator laser.

Therefore, it was confirmed that the output beam having high spectral purity was achievable throughout whole tuning range in the external resonator laser of the present example in contrast with the output beam in the conventional Littman-type wavelength tunable laser in which strong spontaneous emission (ASE) was overlapped. It was also confirmed that SMSR with high spectral purity was maintained to 60 dB or more in the external resonator laser of the present example in contrast with SMSR in the comparative external resonator laser which was reduced to about 20 dB at the both sides of 100 nm tuning range.

Figure 12:
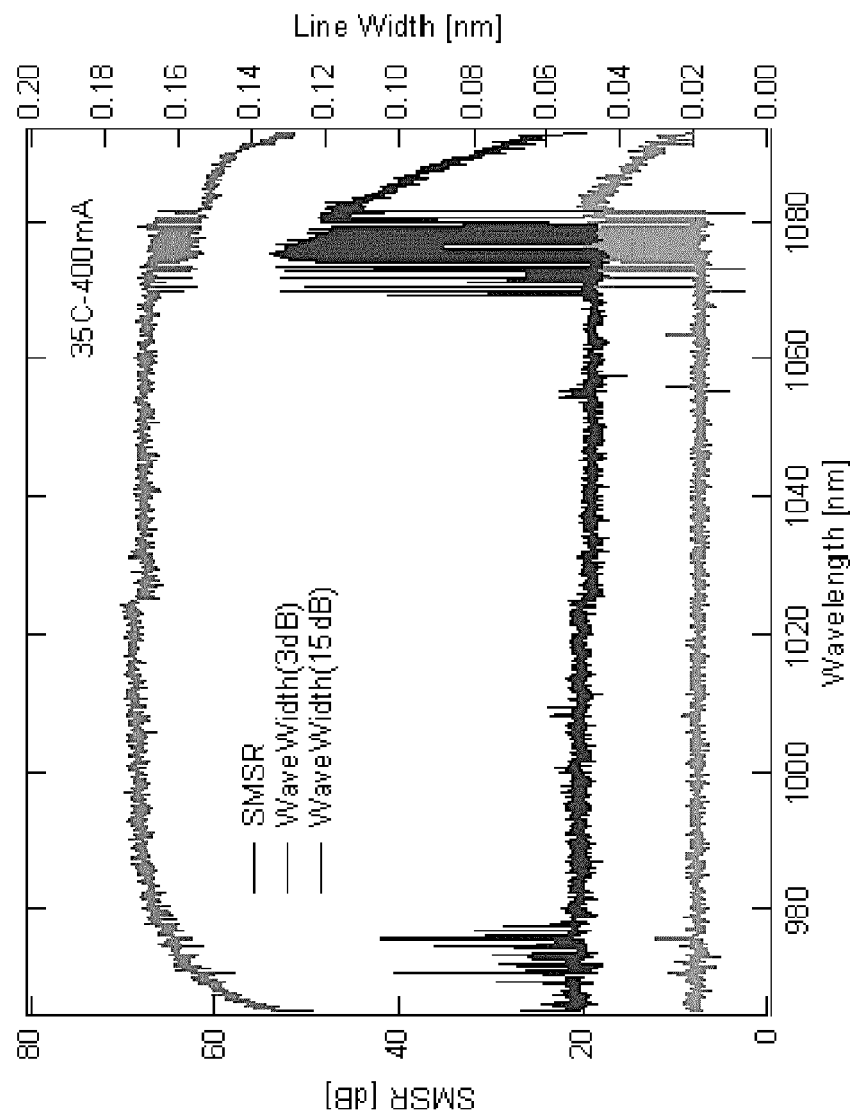
FIG. 12 shows wavelength dependences of emission line width and SMSR.
Figure 13:
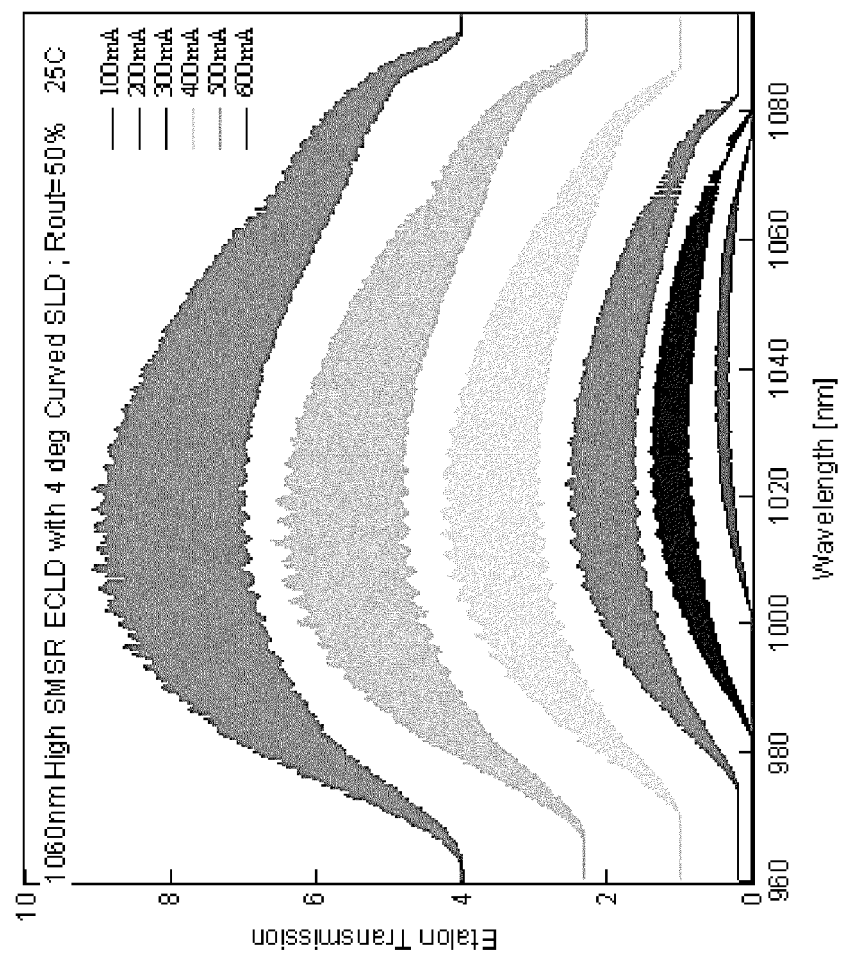
FIG. 13 shows etalon transmission characteristics of an output beam.

By the way, wavelength dependences of laser emission line width and SMSR were measured at 400 mA, and etalon transmission property of the output beam was also measured according to the external resonator laser of the present example. These results are shown in FIGS. 12 and 13, respectively. Thus, it was confirmed that stable narrow line amplitude emission was obtainable within center of 90 nm range. In addition, output power which uses the half mirror having 50% of reflectivity was about 100 mW, and further higher output power was obtainable by reducing reflectivity.

Example 2

The present example 2 was practically the same as above example 1 except the arrangement of the laser diode. Hereinafter, details are described.

Figure 14:
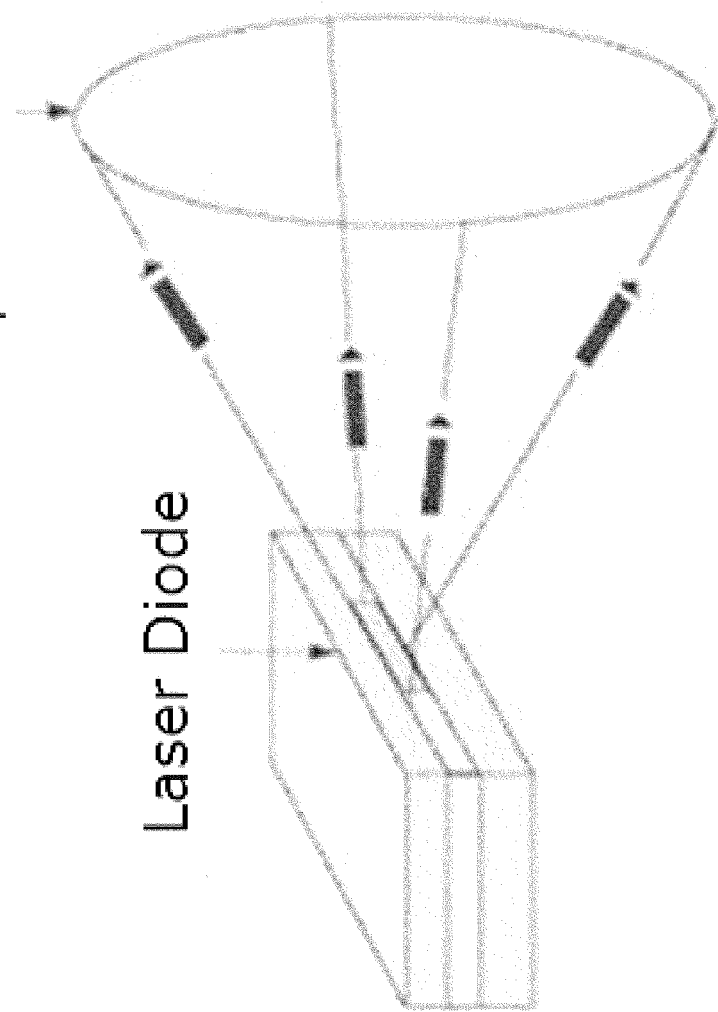
FIG. 14 shows a profile of a radiation beam of a semiconductor laser.

A semiconductor laser manufactured by semiconductor epitaxy such as MBE or MOCVD had a configuration as shown in FIG. 3 and had different optical confinement structures in laminated direction and vertical direction with respect to the laminated direction. For this reason, as shown in FIG. 14(a), the emission beam profile became an elliptical shape. In particular, the degree of ellipticity of the beam increases, since the stripe width was widely taken in a high output power laser chip. FIG. 14(b) shows a beam profile that was obtained by collimating an irradiated beam from the semiconductor laser used in the present example with aspheric lens having focal length of 8 mm. The collimated beam shown in this FIG. 14(b) had a strong anisotropy of about 6 mm in the epitaxial growth direction and about 1.6 mm in the vertical direction with respect to the epitaxial growth direction. In addition, the gain of the semiconductor laser had a strong polarization dependency depending on quantum well structure, and emission with linearly polarized light was obtained. In the laser chip used in the example, polarization direction of emission was parallel to the surface of epitaxial growth.

The laser beam is commonly used by focusing light with a circular spot or by combining light with a single mode fiber. However, in the case where the beam profile has a strong anisotropy as used in the semiconductor laser, it is necessary that the beam is compensated for being a circular shape beam by anamorphic prism pair lens. However, anamorphic prism pair lens are a high cost optical part with large size. Moreover, a problem regarding light focusing on a desired position or combining light with the single mode fiber happens, since a little shift of angle or arrangement causes the output beam to deviate. In the case where Littman-type resonator arrangement derives zero-order diffracted light at the diffraction grating as output, it is necessary to compensate a beam profile by using anamorphic prism pair lens, etc., since the collimated beam from the semiconductor laser is derived with its own profile as output.

Figure 15:
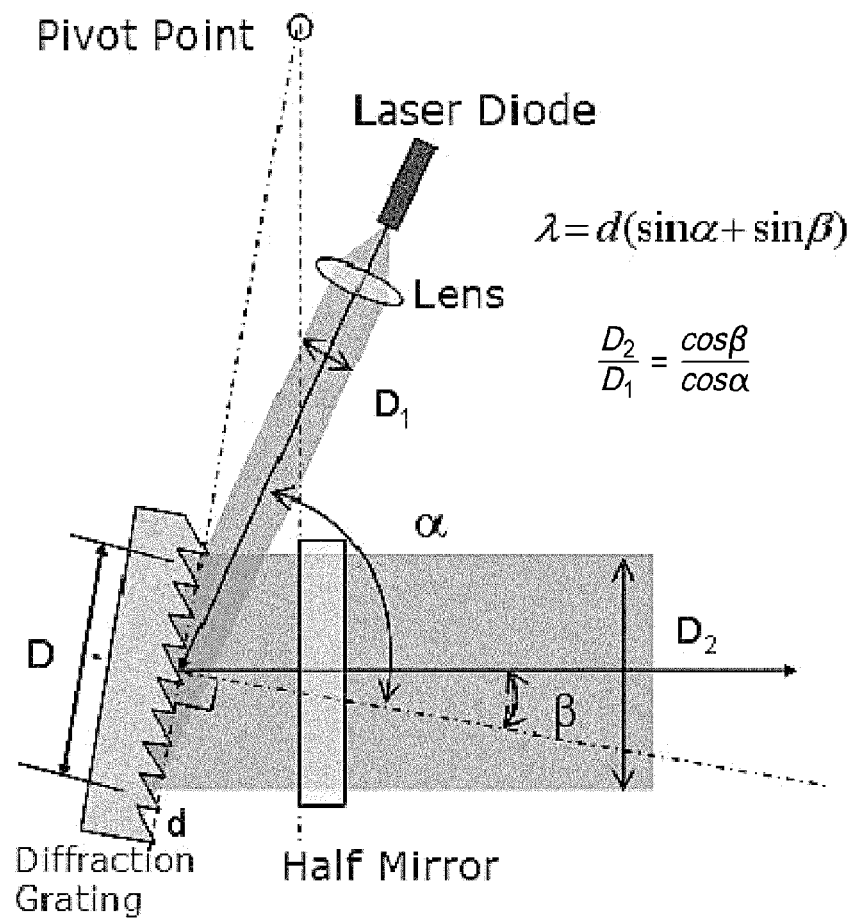
FIG. 15 shows a conversion of a beam profile by a diffraction grating.

However, in the external resonator laser deriving output of first-order diffracted light at the diffraction grating, for example as shown in FIG. 15, it is possible to convert the beam profile of the collimated beam from the laser diode. That is, in the case where incident angle of the collimated beam to the diffraction grating is defined as $\alpha$ and diffracted angle at the diffraction grating is defined as $\beta$, the beam profile of the diffracted beam spreads out in the diffraction direction by a factor of $\cos(\alpha)/\cos(\beta)$. For example, the laser beam spreads out about five times as much in the diffraction direction (longitudinal direction), when $\alpha$ is 75 degree and $\beta$ is 10 to 20 degree.

Figure 16:
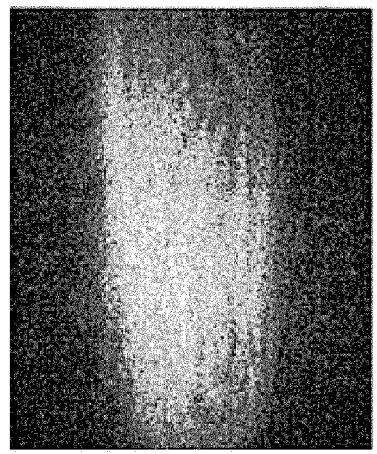
FIG. 16 shows beam profiles of output beams of example 1 and example 2.
Figure 16:
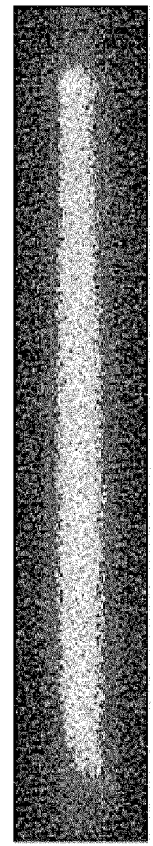

Here, in the present example, the laser chip was rotated by 90 degree with respect to center of axis of the light emission direction, and then minor axis (minor axis means axis along the narrow width direction in the collimated beam, while major axis means axis along wide width direction in the collimated beam, i.e., major axis is vertical to minor axis) of the collimated beam was coincide with the diffraction direction of the diffraction grating, whereby the output beam, as shown in FIG. 16(a), could have almost a circular beam shape. Light went through the aspheric lens having focal length of 25 mm, and then light was combined with a polarization maintaining fiber for polarized wave surface, thereby combination efficiency of 60% was obtained. Furthermore, in this arrangement, it was not necessary to insert a $\lambda/2$ plate into the external resonator, since the polarization direction of emission of the laser chip was coincide with the polarization direction where high diffraction efficiency was obtainable at the diffraction grating. In addition, the FIG. 16(b) is a beam profile of output according to the present example 1.

Figure 17:
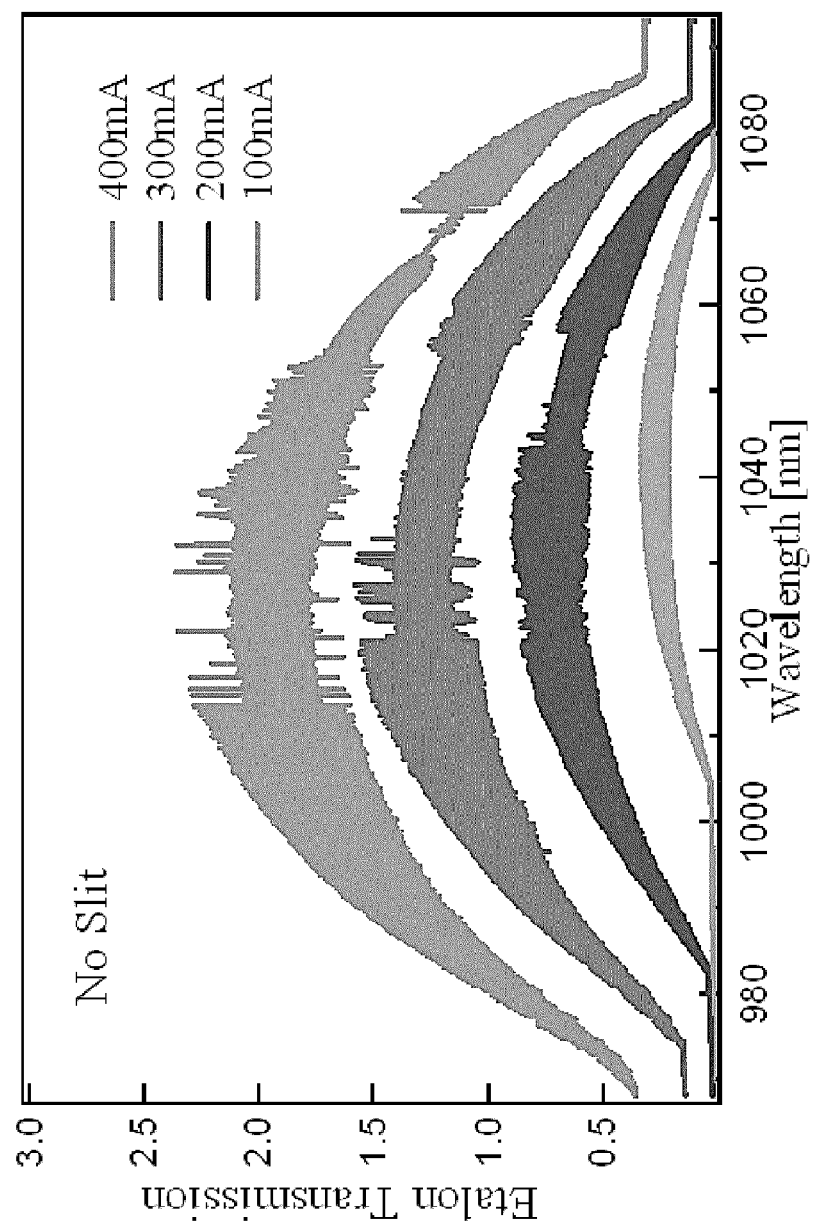
FIG. 17 shows etalon transmission signals of output of an external resonator laser according to example 2.
Figure 18:
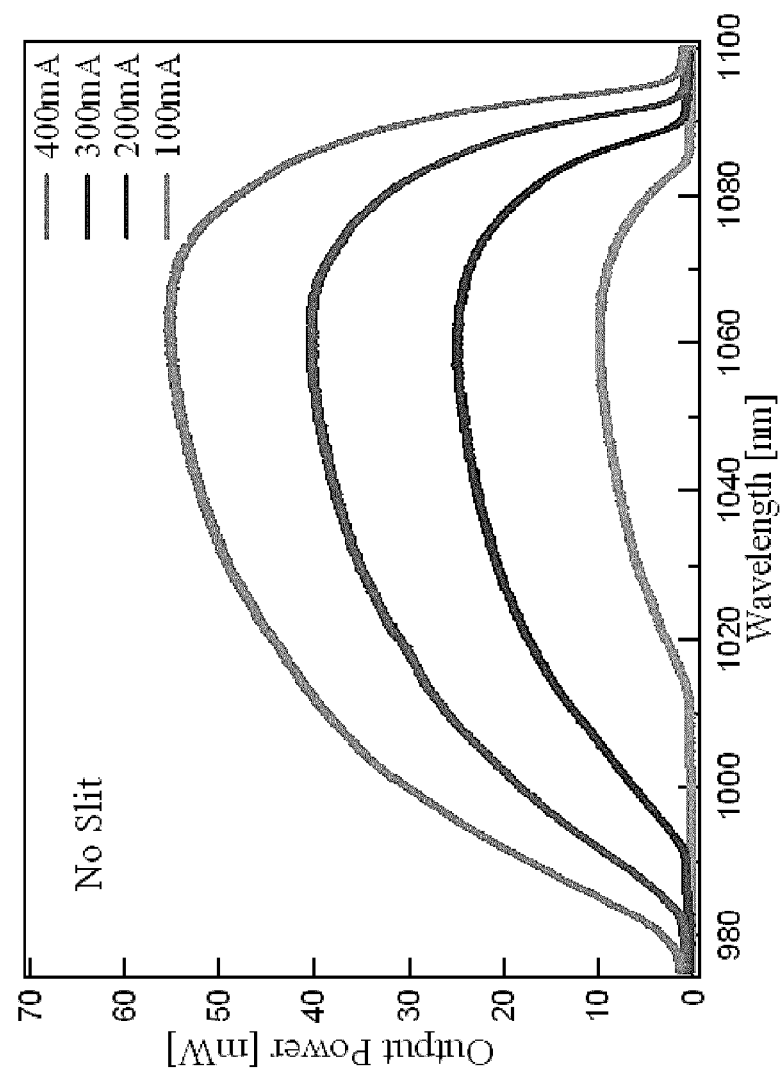
FIG. 18 shows wavelength dependences of outputs of an external resonator laser according to example 2.

FIG. 17 shows transmission signals of etalon (FSR:10 GHz) of the output beams of the external resonator laser according to the present example 2. It was confirmed that high spectral purity output, similarly to the example 1, was obtainable without overlapping of spontaneous emission in the output. In addition, FIG. 18 shows wavelength dependences of the output beams on each input electric current of the external resonator according to the present example 2.

Example 3

Figure 19:
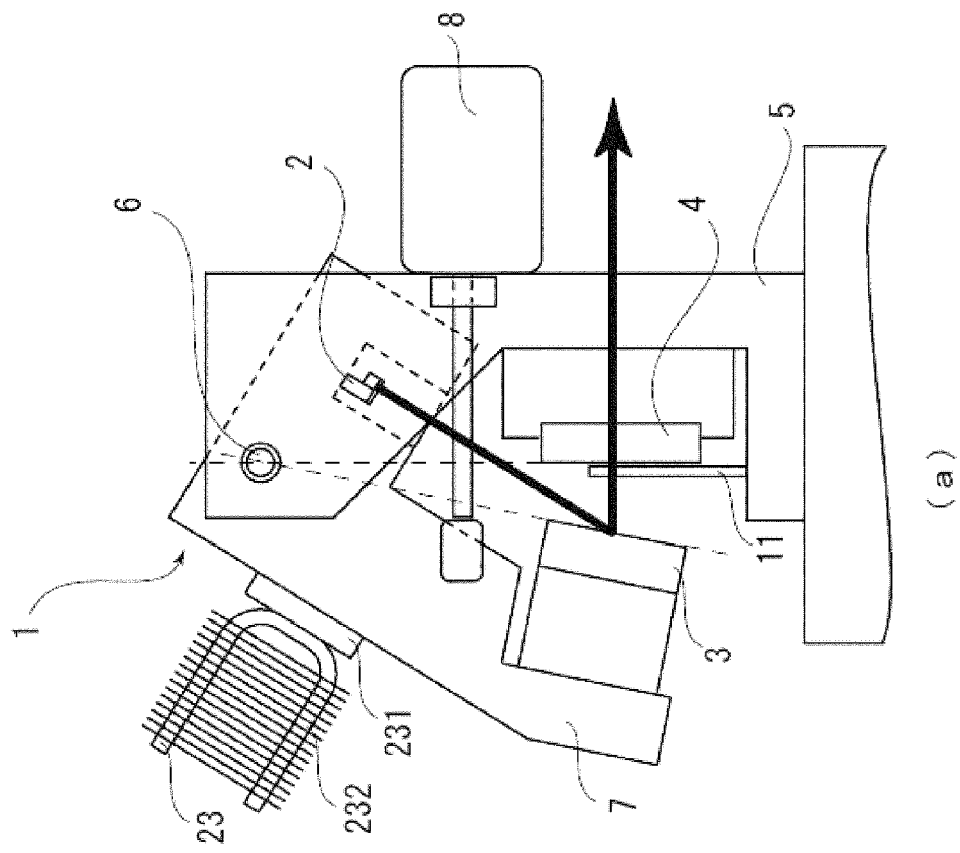
FIG. 19 a schematic perspective view of a slit according to example 3.

Example 3 was almost the same as the example 2 except that a slit 11 was arranged adjacent to the half mirror 4 along the horizontal direction. FIG. 19 shows a schematic view of the slit 11. FIG. 19(a) shows a schematic side view of the external resonator and FIG. 19(b) shows a schematic front view of the half mirror 4, respectively.

Figure 20:
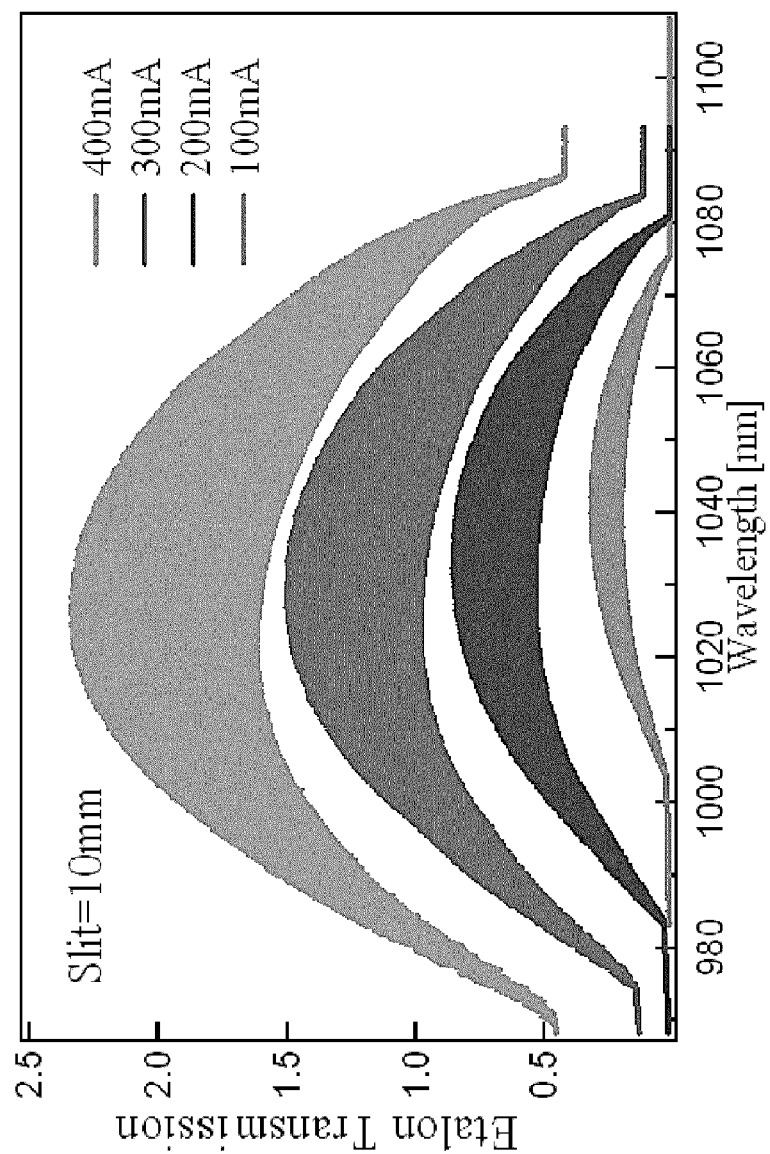
FIG. 20 shows etalon transmission signals of an external resonator laser according to example 3.

FIG. 20 shows transmission signals of etalon (FSR:10 GHz) of the output beams of the external resonator according to the present example 3. In the example 2, periodical transmission signal becomes unstable along with increase of input electric current (output), so that emission occurs in a plurality of longitudinal modes (frequencies), as seen in FIG. 17. However, in the present example 3, it was confirmed that excellent etalon transmission signal ensuring satisfactory single frequency emission was obtainable throughout the whole tuning range above 100 nm with respect to the whole input electric current range up to 400 mA, since the slit was adjacent to the half mirror, and arranged in the resonator with 10 mm of width in the diffraction grating. That is, in the external resonator laser according to the present example 3, it was known that the arrangement of the slit 11 adjacent to the half mirror 4 for limiting the beam to the diffraction direction of the diffraction grating was efficient for the stability of the single emission mode operation.

Figure 21:
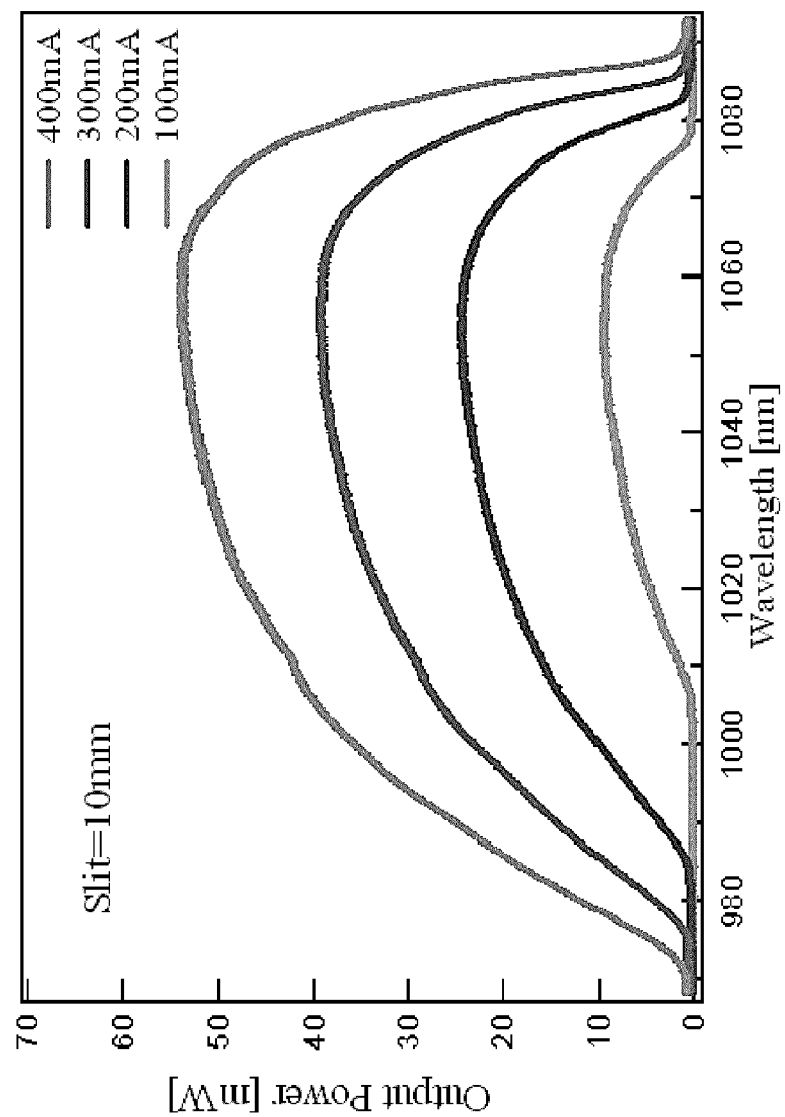
FIG. 21 shows wavelength dependences of outputs of an external resonator laser according to example 3.

In addition, FIG. 21 shows wavelength dependences of output powers of the external resonator laser according to the present example 3. As shown in FIG. 21, it was confirmed that reduction of the output was extremely small and using a slit was very useful even though the slit was arranged.

As aforementioned, it was confirmed that the present examples were useful for improvement of spectral purity and enhancement of the beam profile for the external resonator laser.

INDUSTRIAL APPLICABILITY

The present invention is industrially applicable for the external resonator laser.

DESCRIPTION OF NUMERALS

1: external resonator laser, 2: laser chip, 3: diffraction grating, 4: half mirror, 5: fixed support body, 6: shaft, 7: rotatory support body, 8: driving mechanism, 9: collimator lens, 10: $\lambda/2$ plate, 11: slit

The invention claimed is:

1. A tunable external resonator laser comprising:
a fixed support body in which a half mirror partially reflecting incident light and partially transmitting incident light is fixed; and
a rotatory body which is rotatably supported with a pivot axis against the fixed support body, and in which a laser chip emitting light, a collimator lens collimating light emitted from the laser chip, and a diffraction grating diffracting collimated light from the collimator lens are fixed,
wherein the laser chip, collimator lens, and diffraction grating are configured to rotate relative to the half minor during operation of the laser.

2. The tunable external resonator laser according to claim 1, wherein the laser chip, the collimation lens, the diffraction grating, and the half mirror constitutes a resonator arrangement of Littman-type.

3. The tunable external resonator laser according to claim 1, wherein a laser beam having an elliptical shape collimated by the collimator lens is converted into a laser beam having a nearly circular shape through diffraction at the diffraction grating and the laser beam is derived as an output beam through the half minor.

4. The tunable external resonator laser according to claim 1, further comprising a cooling member which has a peltier element fixed in the rotatory support body, and cooling fins attached by heat pipes and connected with the peltier element.

5. The tunable external resonator laser according to claim 1, wherein the laser chip uses a curved waveguide structure or an oblique waveguide structure.

6. The tunable external resonator laser according to claim 1, wherein a light scattering body beam filter is arranged on a front surface of the laser chip.

7. The tunable external resonator laser according to claim 1, wherein a $\lambda/2$ plate is arranged between the collimator lens and the diffraction grating.

8. The tunable external resonator laser according to claim 1, wherein a slit is arranged adjacent to the half mirror.

* * * * *

UNITED STATES PATENT AND TRADEMARK OFFICE
CERTIFICATE OF CORRECTION

PATENT NO. : 9,042,422 B2  
APPLICATION NO. : 13/519463  
DATED : May 26, 2015  
INVENTOR(S) : Muro et al.

It is certified that error appears in the above-identified patent and that said Letters Patent is hereby corrected as shown below:

In the specification,

In column 3, line 40-41, please change "trans mitting" to -- transmitting --.

In column 10, line 9, please change "$\cos(\alpha)/\cos(\beta)$." to -- $\cos(\beta)/\cos(\alpha)$. --.

In column 10, line 25, please change "maintainin g" to -- maintaining --.

In the claims,

In Claim 1, column 12, line 5, please change "minor" to -- mirror --.

In Claim 3, column 12, line 15, please change "minor" to -- mirror --.

Signed and Sealed this  
Fifteenth Day of March, 2016

Michelle K. Lee  
*Director of the United States Patent and Trademark Office*